(12) United States Patent
Fukuma et al.

(10) Patent No.: US 9,735,221 B2
(45) Date of Patent: Aug. 15, 2017

(54) DISPLAY MODULE

(71) Applicant: Japan Display Inc., Tokyo (JP)

(72) Inventors: Toshihiko Fukuma, Tokyo (JP); Norio Oku, Tokyo (JP)

(73) Assignee: Japan Display Inc., Tokyo (JP)

( * ) Notice: Subject to any disclaimer, the term of this patent is extended or adjusted under 35 U.S.C. 154(b) by 23 days.

(21) Appl. No.: 15/006,481

(22) Filed: Jan. 26, 2016

(65) Prior Publication Data

US 2016/0218166 A1    Jul. 28, 2016

(30) Foreign Application Priority Data

Jan. 28, 2015  (JP) ................. 2015-014780

(51) Int. Cl.
| | | |
|---|---|---|
| *H01L 29/88* | (2006.01) | |
| *H01L 27/32* | (2006.01) | |
| *H01L 25/16* | (2006.01) | |
| *H05K 1/14* | (2006.01) | |

(52) U.S. Cl.
CPC ........ *H01L 27/3276* (2013.01); *H01L 25/167* (2013.01); *H01L 27/323* (2013.01); *H05K 1/147* (2013.01); *H01L 2251/5338* (2013.01); *H01L 2924/0002* (2013.01); *H05K 2201/041* (2013.01); *H05K 2201/09063* (2013.01); *H05K 2201/10128* (2013.01)

(58) Field of Classification Search
CPC . H01L 27/3276; H01L 27/323; H01L 25/167; H01L 2924/0002; H01L 2251/5338; H05K 1/147; H05K 2201/041; H05K 2201/10128; H05K 2201/09063

USPC ............................................... 257/88
See application file for complete search history.

(56) References Cited

U.S. PATENT DOCUMENTS

| | | | |
|---|---|---|---|
| 9,104,076 B2* | 8/2015 | Son .................. | G02F 1/1345 |
| 9,219,207 B2* | 12/2015 | Abe .................. | H01L 33/62 |
| 2006/0098392 A1* | 5/2006 | Sakurai ............ | G02F 1/13452 |
| | | | 361/520 |
| 2006/0193117 A1* | 8/2006 | Miyata ............. | G02F 1/13452 |
| | | | 361/749 |
| 2007/0152577 A1 | 7/2007 | Cho et al. | |
| 2008/0062109 A1* | 3/2008 | Kim ................. | G02F 1/13452 |
| | | | 345/92 |
| 2008/0084520 A1* | 4/2008 | Nam ................ | G02B 6/0068 |
| | | | 349/65 |
| 2008/0192505 A1* | 8/2008 | Park ................ | G02B 6/009 |
| | | | 362/615 |

(Continued)

FOREIGN PATENT DOCUMENTS

| | | |
|---|---|---|
| JP | 2007-183605 A | 7/2007 |
| JP | 2011-034066 A | 2/2011 |

(Continued)

OTHER PUBLICATIONS

Korean Office Action dated Mar. 27, 2017 for corresponding Korean Application 10-2016-0008565.

*Primary Examiner* — Phat X Cao
*Assistant Examiner* — Mohammad M Hoque
(74) *Attorney, Agent, or Firm* — Typha IP LLC

(57) ABSTRACT

The display module includes first and second FPC substrates disposed on top of each other. The first substrate has an IC mounted on it. The second FPC substrate has a cutout inside which the IC is disposed.

6 Claims, 5 Drawing Sheets

(56) References Cited

U.S. PATENT DOCUMENTS

| | | | |
|---|---|---|---|
| 2009/0115743 A1* | 5/2009 | Oowaki | G06F 3/044 345/174 |
| 2009/0174825 A1* | 7/2009 | Yee | G06F 1/1601 348/801 |
| 2009/0213292 A1* | 8/2009 | Park | G02F 1/13452 349/58 |
| 2010/0026952 A1* | 2/2010 | Miura | G02F 1/133305 349/150 |
| 2011/0007042 A1* | 1/2011 | Miyaguchi | G02F 1/133305 345/204 |
| 2011/0050657 A1* | 3/2011 | Yamada | H01L 27/3293 345/204 |
| 2011/0157512 A1* | 6/2011 | Mishima | G02B 6/0068 349/58 |
| 2011/0187965 A1* | 8/2011 | Ooishi | G09F 13/04 349/62 |
| 2013/0002133 A1 | 1/2013 | Jin et al. | |
| 2013/0328051 A1* | 12/2013 | Franklin | H01L 29/786 257/59 |
| 2014/0247405 A1 | 9/2014 | Jin et al. | |
| 2014/0307396 A1* | 10/2014 | Lee | H05K 1/028 361/749 |
| 2014/0355227 A1* | 12/2014 | Lim | H05K 1/028 361/749 |
| 2016/0216738 A1* | 7/2016 | Fukuma | G06F 1/1652 |

FOREIGN PATENT DOCUMENTS

| | | |
|---|---|---|
| JP | 2013-015835 A | 1/2013 |
| KR | 10-2014-0122597 A | 10/2014 |

\* cited by examiner

DISPLAY MODULE

CROSS-REFERENCE TO RELATED APPLICATION

The present application claims priority from Japanese application JP2015-014780 filed on Jan. 28, 2015, the content of which is hereby incorporated by reference into this application.

BACKGROUND OF THE INVENTION

1. Field of the Invention

The present invention relates to display modules.

2. Description of the Related Art

As disclosed in JP 2007-183605 A and JP 2013-015835 A, display modules into which a plurality of flexible substrates are integrated are conventionally known. Some of the display modules each include two superposed circuit substrates: one is provided with an image display function, and the other has an additional function added to the image display function. Examples of the circuit substrate provided with the additional function include a touch screen provided with an input function that enables users to operate a device by pressing an object displayed on its screen. A flexible wiring substrate is joined to an edge of each of the circuit substrates disposed on top of each other, and those flexible wiring substrates are bent on the side opposite from the image displaying side.

If one of the superposed flexible wiring substrates has an electronic component, such as an integrated circuit (IC), mounted thereon, the electronic component may interfere with the other flexible wiring substrate and cause an electrical connection failure between the flexible wiring substrates.

SUMMARY OF THE INVENTION

In view of the above problem, it is an object of the present invention to prevent an electronic component mounted on one flexible wiring substrate from interfering with the other flexible wiring substrate.

A display module according to an aspect of the present invention has a first circuit substrate, a second circuit substrate, a first flexible wiring substrate, a second flexible wiring substrate, and an electronic component. The first circuit substrate is flexible, has a display area provided with an image display function, and has a first peripheral area outside the display area. The second circuit substrate is flexible, has an additional function area provided with a function added to the image display function, and has a second peripheral area outside the additional function area. The second circuit substrate is disposed on top of the first circuit substrate. The first flexible wiring substrate is joined to a first edge of the first peripheral area so as to be electrically coupled to the first circuit substrate. The second flexible wiring substrate is disposed to on top of the first flexible wiring substrate, and is joined to a second edge of the second peripheral area so as to be electrically coupled to the second circuit substrate. The first circuit substrate has a first curved portion in the first peripheral area. The second circuit substrate has a second curved portion in the second peripheral area. The first and second flexible wiring substrates each extend toward the opposite side of the first circuit substrate from the second circuit substrate. One of the first and second flexible wiring substrates has the electronic component mounted on it. The other of the first and second flexible wiring substrates has a cutout inside which the electronic component is disposed. In this display module, the electronic component is disposed inside the cutout. Thus, the electronic component, which is mounted on one of the flexible wiring substrates, is prevented from interfering with the other flexible wiring substrate. In addition, the display module can be made thinner by the thickness of the electronic component, which is disposed inside the cutout.

DETAILED DESCRIPTION OF THE INVENTION

The following describes an embodiment of the present invention (hereinafter, referred to as "this embodiment") with reference to the accompanying drawings.

Figure 1:
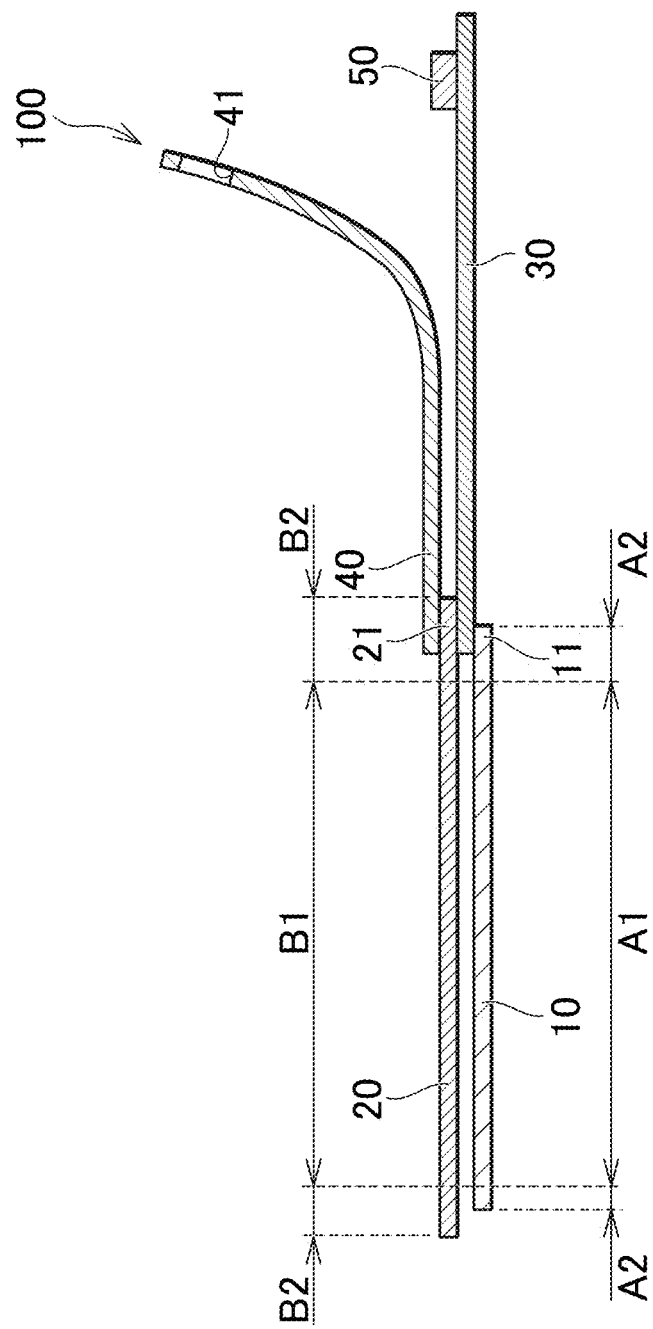
FIG. 1 is a diagram schematically showing a cross section of a display module according to this embodiment.
Figure 2:
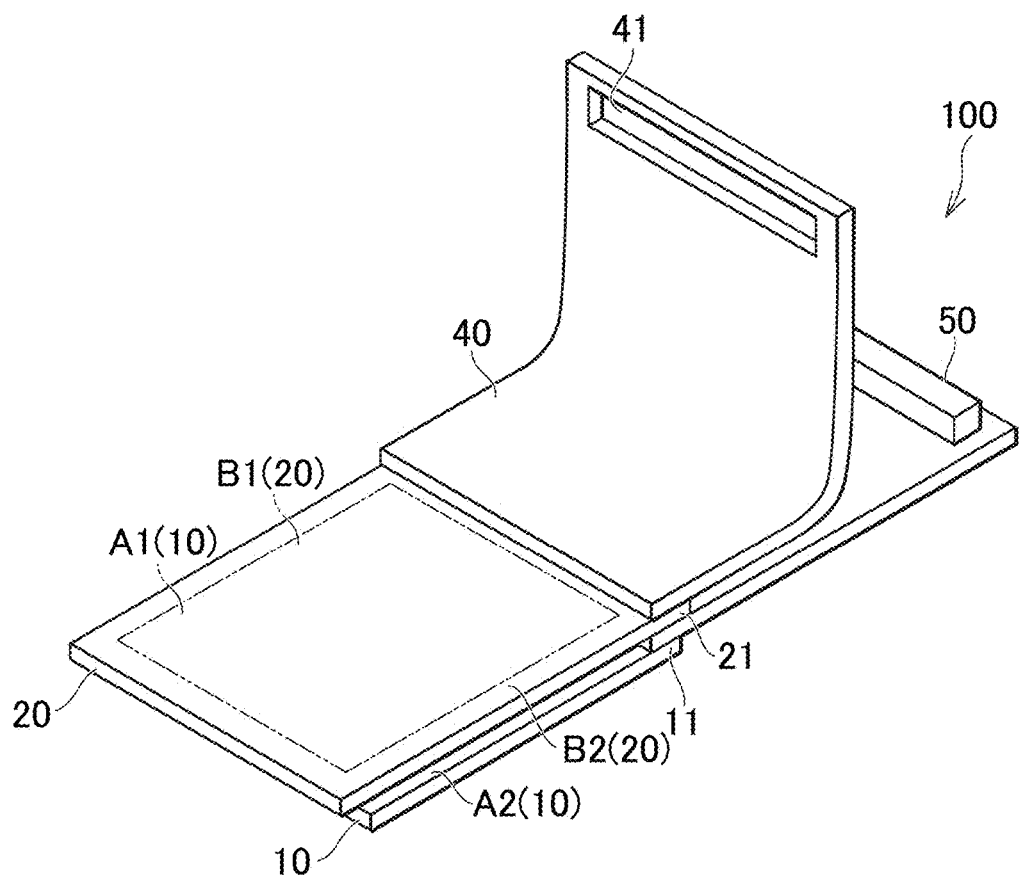
FIG. 2 is a schematic external perspective view of the display module according to this embodiment.
Figure 3:
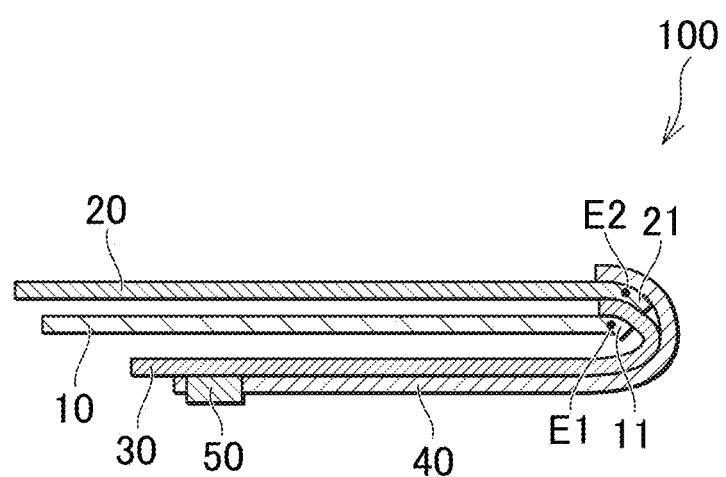
FIG. 3 is a diagram schematically showing a cross section of the display module according to this embodiment, whose substrates are bent.
Figure 4A:
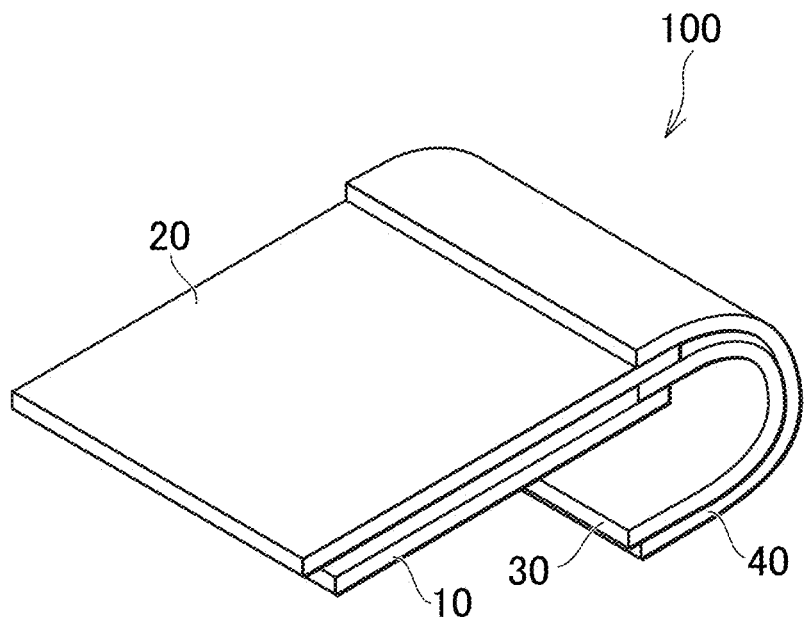
FIG. 4A is a perspective view of the display module whose substrates are bent, when viewed from the front surface side of its display area.
Figure 4B:
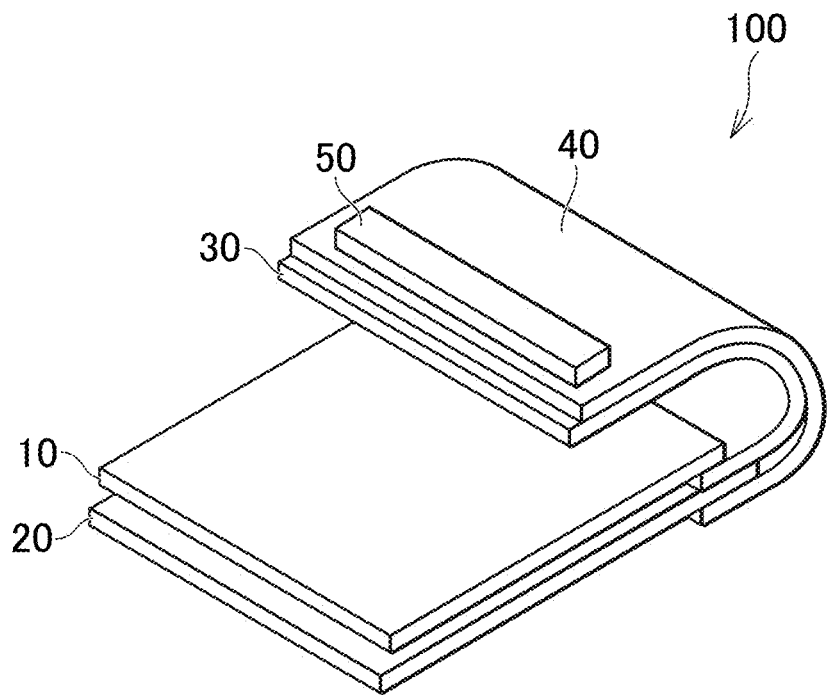
FIG. 4B is a perspective view of the display module whose substrates are bent, when viewed from the back surface side of its display area.

FIG. 1 is a diagram schematically showing a cross section of a display module according to this embodiment. FIG. 2 is a schematic external perspective view of the display module according to this embodiment. FIG. 3 is a diagram schematically showing a cross section of the display module according to this embodiment, whose substrates are bent. FIG. 4A is a perspective view of the display module whose substrates are bent, when viewed from the front surface side of its display area. FIG. 4B is a perspective view of the display module whose substrates are bent, when viewed from the back surface side of its display area. An image display panel 10 has a display area. The front surface of the display area is the surface facing a touch screen. 20 and the back surface of the display area is the opposite side of the image display panel 10 from the touch screen 20.

A display module 100 has the image display panel 10 as a first circuit substrate and the touch screen 20 as a second circuit substrate. The image display panel 10 is flexible. The image display panel 10 has a display area A1 (the area inside a two-dot chain line in FIG. 2) provided with an image display function, and a first peripheral area A2 (the area outside the two-dot chain line in FIG. 2) that is outside of the display area A1. As shown in FIG. 1, the display area A1 is superposed on an additional function area B1 of the touch screen 20 described below.

Although not shown in detail, the image display panel 10 is a flexible organic electroluminescent (EL) display device and includes a thin film transistor (TFT) substrate and a counter substrate (e.g., a sealing substrate or a color filter substrate). The TFT substrate includes a TFT circuit layer, an organic EL layer, a sealing layer, and other layers. The TFT circuit layer controls light emission of the organic EL layer. The sealing layer is made of an inorganic insulating material that covers the organic EL layer. Examples of the image display panel 10 include display devices for mobile terminals.

The touch screen 20 is flexible. The touch screen 20 has the additional function area B1 (the area inside a dashed line in FIG. 2) provided with a function added to the image display function of the image display panel 10, and a second peripheral area B2 (the area outside the dashed line in FIG. 2) that is outside of the additional function area B1. The touch screen 20 is disposed on top of the image display panel 10. In the display module 100 according to this embodiment, a touch screen provided with an input function is employed as the second circuit substrate. The input function enables users to operate a device by pressing an object displayed on its screen. However, the present invention is not limited to this configuration. The second circuit substrate may be any other circuit substrate that has a function added to the image display function and to which a flexible printed circuit (FPC) substrate is electrically coupled. For example, the second circuit substrate may be a circuit substrate provided with an additional function that can produce 3D images, such as a parallax barrier. The touch screen 20 itself may double as a counter substrate of the image display panel 10.

As shown in FIG. 1 and other figures, the display module 100 according to this embodiment has a FPC substrate 30 as a first flexible wiring substrate and a FPC substrate 40 as a second flexible wiring substrate. The FPC substrates 30 and 40 are each a substrate that is made of a base material formed by laminating an insulating resin material and a conductive metal and that has an electric circuit.

The FPC substrate 30 is joined to a first edge 11 in the first peripheral area A2 of the image display panel 10 so as to be electrically coupled to the image display panel 10. The FPC substrate 40 is joined to a second edge 21 in the second peripheral area B2 of the touch screen 20 so as to be electrically coupled to the touch screen 20. The image display panel 10 and the touch screen 20 are each a substantially rectangular substrate in a plan view and are disposed on top of each other so that the direction from the display area A1 to the first edge 11 and the direction from the additional function area B1 to the second edge 21 are the same. The FPC substrates 30 and 40 are disposed on top of each other.

An IC 50 as an electronic component is mounted on the FPC substrate 30. As shown in FIGS. 1 and 2, in this embodiment, the IC 50 is mounted on the surface facing the FPC substrate 40 and near an edge of the FPC substrate 30 which is opposite to the edge joined to the first edge 11 of the image display panel 10. The IC 50, which is mounted on the front surface of the FPC substrate 30, protrudes from the front surface of the FPC substrate 30 by the thickness of the IC 50. Also as shown in FIG. 2 and other figures, the IC 50 in this embodiment is formed in a substantially rectangular prism to extend in the direction (transverse direction) perpendicular to the longitudinal direction of the FPC substrate 30 having a substantially rectangular shape.

In contrast, the FPC substrate 40 has a cutout 41. As shown in FIGS. 1 and 2, the cutout 41 is formed, in the FPC substrate 40, closer to the leading edge, that is, closer to the opposite edge than the edge joined to the second edge 21 of the touch screen 20.

To modularize components, such as the image display panel 10, the touch screen 20, the FPC substrate 30, and the FPC substrate 40 which are disposed on top of each other, an edge of the image display panel 10 and an edge of the touch screen 20 are each curved, and the FPC substrates 30 and 40 are each bent so as to extend toward the opposite side of the image display panel 10 from the touch screen 20. The components thus modularized, including four substrates disposed on top of each other, are included in, for example, a housing. Specifically, as shown in FIGS. 3, 4A and 4B, the flexible image display panel 10 has a first curved portion E1 in the first peripheral area A2. In this embodiment, the first curved portion E1 is formed at the first edge 11. Guided by the curve of the image display panel 10, the FPC substrate 30, which is joined to the image display panel 10, is bent in the direction of curvature of the first curved portion E1 and then extended along the back surface side of the image display panel 10.

The touch screen. 20 has a second curved portion. E2 in the second peripheral area B2. In this embodiment, the second curved portion. E2 is formed at the second edge 21. The FPC substrate 40, which is joined to the touch screen 20, is bent in the direction of curvature of the second curved portion E2 and then extended along the back surface side of the image display panel 10.

As shown in FIGS. 3 and 4B, the cutout 41 of the FPC substrate 40 is shaped so that the IC 50 mounted on the FPC substrate 30 is disposed inside the cutout 41 with the FPC substrates 30 and 40 extending toward the on the opposite side of the image display panel 10 from the touch screen 20. Thus, the IC 50 mounted on the FPC substrate 30 is not in contact with the front surface of the FPC substrate 40.

In the display module 100 according to this embodiment, use of the above configuration prevents the IC 50 mounted on the FPC substrate 30 from interfering with the FPC substrate 40. Consequently, an electrical connection failure between the FEC substrates 30 and 40 is prevented. In addition, interference of the IC 50 is prevented from causing damage to the FPC substrate 40. Consequently, an electrical connection failure caused by damage to the FEC substrate 40 is prevented.

As in this embodiment, curving the first peripheral area A2 of the image display panel 10 and the second peripheral area B2 of the touch screen 20 reduces the first peripheral area A2, which is on the same plane as the display area A1, and thus narrows the frame of the display module 100.

The image display panel 10, the touch screen 20, the FPC substrate 30, and the FPC substrate 40, which are flexible, are curved by elastic deformation and thus acted on by a restoring force to return to their original shapes from the curved shapes. In this embodiment, the IC 50 and the cutout 41 are engaged to resist the restoring force produced by the elastic deformation. Specifically, when the restoring force acts on the substrates, the inner surface of the cutout 41 of the FPC substrate 40 and the side surfaces of the IC 50 mounted on the FPC substrate 30 come into contact with each other, and the restoring force causes a reaction force acting in the direction opposite to the direction of the elastic deformation at the contact portion. Thus, the relative position between the FPC substrates 30 and 40 is kept unchanged and each substrate remains curved. Consequently, the shape of each substrate is kept and its deformation is prevented. Also in this embodiment, the IC 50 and the cutout 41 are formed to extend in the transverse direction of the image display panel 10 and the such screen 20, and thus the reaction force acting in the direction opposite to the direction of the elastic deformation is caused along the transverse direction by the restoring force. Accordingly, each substrate remains curved, the shape of each substrate is kept, and its deformation is prevented, more reliably.

Although the cutout in this embodiment shown in FIGS. 1 to 4B is formed through the FPC substrate 40 from the back surface to the front surface, the cutout in the present invention is not limited to such a through cutout. It may be any recess that is shaped to conform to the shape of the IC 50 so that the IC 50 mounted on the FPC substrate 30 is disposed inside it with the FPC substrates 30 and 40 curved.

In this embodiment, as shown in FIGS. 3 and 4B, the IC 50 is thicker than the FPC substrate 40, and thus the IC 50 engaged in the cutout 41 protrudes through the FPC substrate 40 from the back surface. The IC 50, which is made thicker than the FPC substrate 40, is more easily hooked into the cutout 41. Consequently, the engagement between the IC 50 and the cutout 41 is held and each substrate more securely remains curved.

The present invention is not limited to the above configuration. One of the first and second flexible wiring substrates may have an electronic component mounted thereon and the other may have a cutout formed therein. That is, the IC 50 as an electronic component may be mounted on the FPC substrate 40 as the second flexible wiring substrate, and the cutout 41 may be formed in the FPC substrate 30 as the first flexible wiring substrate.

Figure 5:
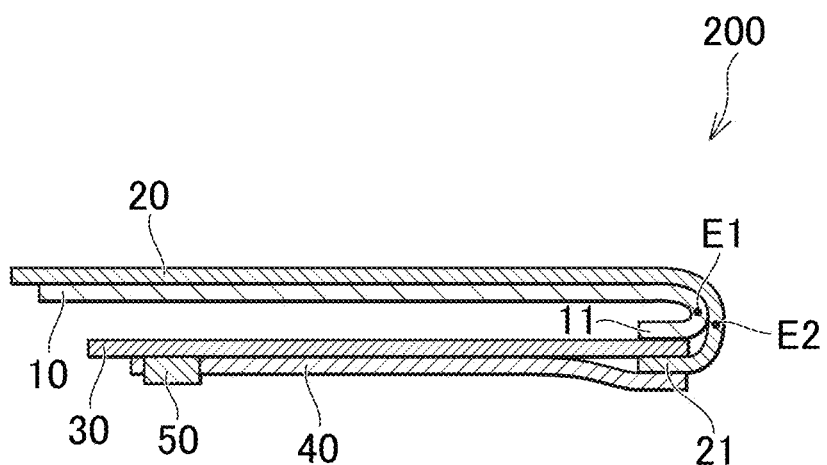
FIG. 5 is a diagram schematically showing a cross section of a display module according to another embodiment.

The following describes a display module 200 according to another embodiment with reference to FIG. 5. FIG. 5 is a diagram showing a cross section of a display module according to the other embodiment. In the above description of FIGS. 1 to 4B, the image display panel 10 has the first curved portion E1 at the first edge 11 and the touch screen 20 has the second curved portion E2 at the second edge 21, whereas in the following description of FIG. 5, the image display panel 10 has the first curved portion E1 between the display area A1 and the first edge 11 and the touch screen 20 has the second curved portion E1 between the additional function area B1 and the second edge 21. The same components as are described with reference to FIGS. 1 to 4B are denoted by the same reference signs, and thus are not described in detail herein.

In the display module 200 shown in FIG. 5, the image display panel 10 is curved at a position closer to the display area A1 in the first peripheral area A2 than that of the display module 100 shown in FIGS. 1 to 4B. The touch screen 20 is also bent at a position closer to the additional function area B1 in the second peripheral area B2. Use of such a configuration reduces the first peripheral area A2, which is on the same plane as the display area A1, and thus further narrows the frame of the display module. While there have been described what are at present considered to be certain embodiments of the invention, it will be understood that various modifications may be made thereto, and it is intended that the appended claims cover all such modifications as fall within the true spirit and scope of the invention.

What is claimed is:

1. A display module comprising:
    a first circuit substrate being flexible, having a display area provided with an image display function, and having a first peripheral area outside the display area;
    a second circuit substrate being flexible, having an additional function area provided with a function added to the image display function, and having a second peripheral area outside the additional function area, the second circuit substrate being disposed on top of the first circuit substrate;
    a first flexible wiring substrate joined to a first edge of the first peripheral area so as to be electrically coupled to the first circuit substrate;
    a second flexible wiring substrate disposed on top of the first flexible wiring substrate, and joined to a second edge of the second peripheral area so as to be electrically coupled to the second circuit substrate; and
    an electronic component, wherein
    the first circuit substrate has a first curved portion in the first peripheral area,
    the first flexible wiring substrate extends toward an opposite side of the first circuit substrate from the second circuit substrate,
    the second circuit substrate has a second curved portion in the second peripheral area,
    the second flexible wiring substrate extends toward an opposite side of the first circuit substrate from the second circuit substrate,
    one of the first and second flexible wiring substrates has the electronic component mounted thereon, and
    the other of the first and second flexible wiring substrates has a cutout inside which the electronic component is disposed.

2. The display module according to claim 1, wherein
the first flexible wiring substrate is curved in a direction of curvature of the first curved portion, and
the second flexible wiring substrate is curved in a direction of curvature of the second curved portion.

3. The display module according to claim 1, wherein
the first curved portion is formed at least at the first edge, and
the second curved portion is formed at least at the second edge.

4. The display module according to claim 1, wherein
the first circuit substrate has the first curved portion between the display area and the first edge, and
the second circuit substrate has the second curved portion between the additional function area and the second edge.

5. The display module according to claim 2, wherein
the first and second flexible wiring substrates are curved by elastic deformation, and
the electronic component and the cutout are engaged to resist a restoring force produced by the elastic deformation.

6. The display module according to claim 1, wherein
the first and second circuit substrates are curved by elastic deformation, and
the electronic component and the cutout are engaged to resist a restoring force produced by the elastic deformation of the first and second circuit substrates.

* * * * *